US006831471B2

(12) United States Patent
Gertiser et al.

(10) Patent No.: US 6,831,471 B2
(45) Date of Patent: Dec. 14, 2004

(54) CONFIGURABLE INTERFACE CIRCUIT FOR EXHAUST GAS OXYGEN SENSORS

(75) Inventors: Kevin M. Gertiser, Noblesville, IN (US); James A. Kinley, Kokomo, IN (US); Ashraf K. Kamel, Kokomo, IN (US); Gregory J. Manlove, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 71 days.

(21) Appl. No.: 10/294,380

(22) Filed: Nov. 14, 2002

(65) Prior Publication Data

US 2004/0095153 A1 May 20, 2004

(51) Int. Cl.$^7$ ........................ G01R 27/08; G01R 27/02

(52) U.S. Cl. ........................ 324/693; 324/609; 324/691

(58) Field of Search ................................ 324/693, 609, 324/691; 204/425

(56) References Cited

U.S. PATENT DOCUMENTS 5,405,521 A * 4/1995 Nakamori et al. .......... 204/425
6,547,955 B1 * 4/2003 Hada et al. ................. 205/781

* cited by examiner

*Primary Examiner*—Anjan Deb
*Assistant Examiner*—John Teresinski
(74) *Attorney, Agent, or Firm*—Stefan V. Chmielewski

(57) ABSTRACT

An oxygen sensor interface circuit is configurable on the fly by an electronic controller such as an engine controller to support oxygen sensors having unique interface requirements, to reliably identify various oxygen sensor faults, and to enable rapid detection of a warmed up sensor. The interface circuit is configurable in a first respect to enable operation with any of a number of different sensors, and in a second respect to enable more reliable fault detection, including measurement of leakage to ground or battery.

5 Claims, 3 Drawing Sheets

CONFIGURABLE INTERFACE CIRCUIT FOR EXHAUST GAS OXYGEN SENSORS

TECHNICAL FIELD

This invention relates to a circuit for interfacing an electronic engine control unit (ECU) to an exhaust gas oxygen sensor, and more particularly to a circuit that can be configured by the ECU to work with different types of oxygen sensors and to diagnose the operation thereof

BACKGROUND OF THE INVENTION

In a motor vehicle engine control system, engine fueling is controlled by a closed-loop control system that includes one or more exhaust gas oxygen sensors, and a corresponding number of circuits for interfacing the oxygen sensors with an electronic controller. Electrically, the oxygen sensor can be characterized as a two terminal analog device, and the interface circuit functions not only to develop a suitable input for the controller, but also to diagnose electrical faults such as shorts and open-circuits. See, for example, the U.S. Pat. No. 5,467,034 to Manlove et al., issued on Nov. 14, 1995, assigned to the assignee of the present invention, and incorporated herein by reference. As described in Manlove et al., the interface circuit can include RC filter elements to remove unwanted noise and a bias voltage to diagnose cold sensor and open-circuit fault conditions. However, oxygen sensors produced by different manufacturers require unique interface circuitry, and leakage paths between the sensor terminals and ground and/or battery make it difficult or impossible to reliably distinguish a normally operating rich-condition sensor from an open-circuit. Accordingly, what is needed is an improved interface circuit that is flexible enough to work with sensors produced by different manufacturers and to reliably diagnose sensor failures.

SUMMARY OF THE PRESENT INVENTION

The present invention is directed to an improved oxygen sensor interface circuit that is configurable on the fly by an electronic controller such as an engine controller to support oxygen sensors having unique interface requirements, to reliably identify various oxygen sensor faults, and to enable rapid detection of a warmed up sensor. According to the invention, the interface circuit is configurable in a first respect to enable operation with any of a number of different sensors, and in a second respect to enable more reliable fault detection, including measurement of leakage to ground or battery.

DESCRIPTION OF THE PREFERRED EMBODIMENT

Figure 1:
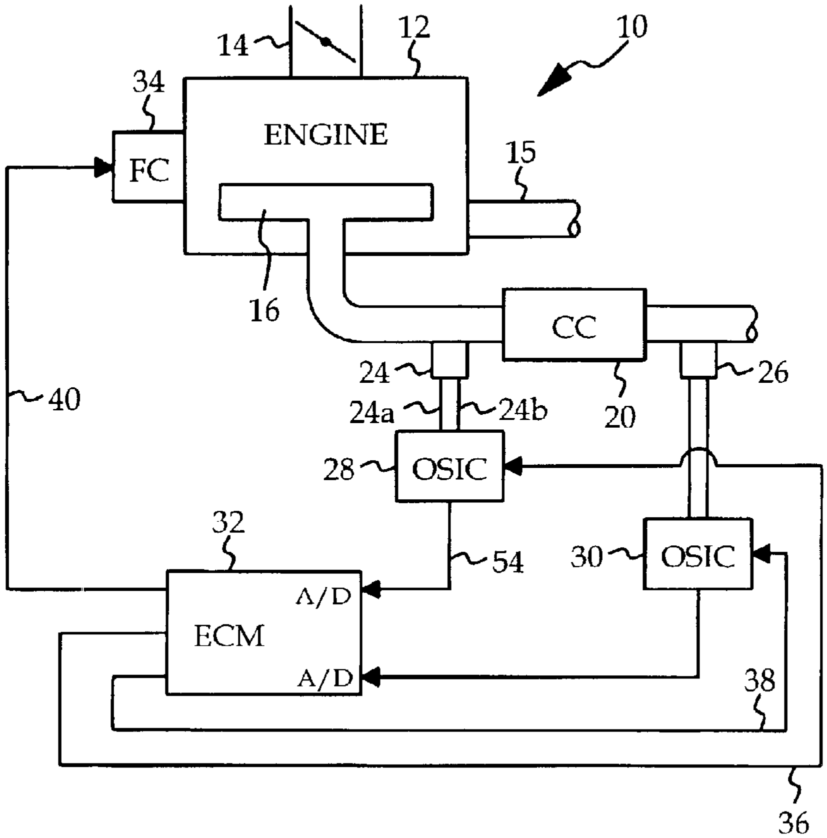
FIG. 1 is a diagram of a motor vehicle powertrain, including pre-catalyst and post-catalyst oxygen sensors, an engine control module, and configurable oxygen sensor interface circuits according to this invention.

Referring to FIG. 1, the interface circuit of the present invention is disclosed in the context of a motor vehicle powertrain 10 including an internal combustion engine 12 having a throttle valve 14 for receiving intake air and an output shaft 15 connected to drive the vehicle. The intake air is combined with fuel supplied by a fuel controller (FC) 34, and supplied to engine cylinders for combustion, with the exhaust gases being collected in an exhaust manifold 16 and passed through a catalytic converter (CC) 20 for emission control purposes. Feedback signals for air/fuel ratio control are developed by a first exhaust gas oxygen sensor 24 located upstream of the converter 20 and a second exhaust gas oxygen sensor 26 located downstream of the converter 20. Oxygen sensor interface circuits (OSIC) 28, 30 couple the respective oxygen sensors 24, 26 to A/D input ports of a microprocessor-based engine control module (ECM) 32, and the ECM 32 regulates the operation of fuel controller 34 based in part on the feedback signals. According to the present invention, the interface circuits 28, 30 are configurable to support oxygen sensors having unique interface requirements and to reliably identify and distinguish various oxygen sensor faults, and the ECM 32 includes outputs 36, 38 for individually configuring the interface circuits 28, 30 as described below.

Figure 2:
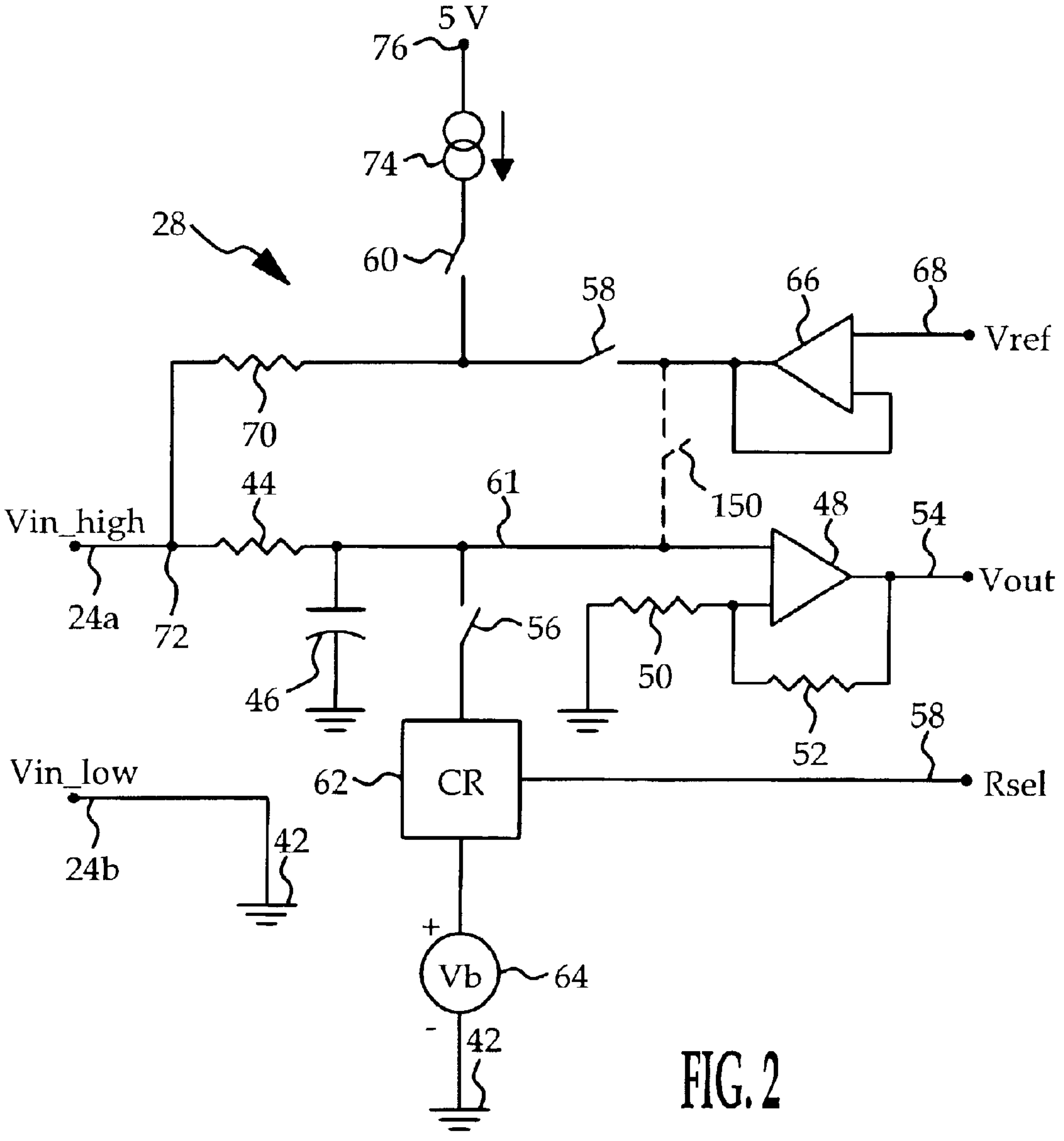
FIG. 2 is a diagram of a configurable oxygen sensor interface circuit according to this invention.

The interface circuits 28, 30 of FIG. 1 are identical, and FIG. 2 depicts a top-level diagram of OSIC 28. The input lines from oxygen sensor 24 are labeled 24*a* and 24*b*, as in FIG. 1, and additionally as Vin_high and Vin_low in FIG. 2. Referring to FIG. 2, Vin_low is coupled to circuit ground 42, while Vin_high is coupled to an interface circuit including a low-pass input filter comprising resistor 44 and capacitor 46, and an amplifier comprising operational amplifier 48 and resistors 50 and 52. The output voltage Vout of operational amplifier 48 on line 54 is applied as an input to an A/D input port of ECM 32 as shown in FIG. 1, and in the illustrated embodiment, the resistors 50 and 52 are selected to define an amplifier gain of 2.5.

The remaining circuit elements of OSIC 28 are selectively coupled to the above-described filter and/or amplifier by the switches 56, 58 and 60, depending on the operating characteristics of oxygen sensor 24. If the oxygen sensor 24 is a so-called narrow-band sensor, the switch 56 is closed and the switches 58 and 60 are opened. If the oxygen sensor 24 is a so-called pumped-voltage reference sensor of the type manufactured by Robert Bosch. Corporation, the switch 58 is closed and the switches 56 and 60 are opened Finally, if the oxygen sensor 24 is a so-called pumped-current reference sensor of the type manufactured by Delphi Corporation, the switch 60 is closed and the switches 56 and 58 are opened. In practice, the switches 56, 58, 60 can be configured as semiconductor switches, the state of each such switch being controlled by the microprocessor of ECM 32 via a serial peripheral interface (SPI) circuit incorporated within ECM 32.

Figure 3:
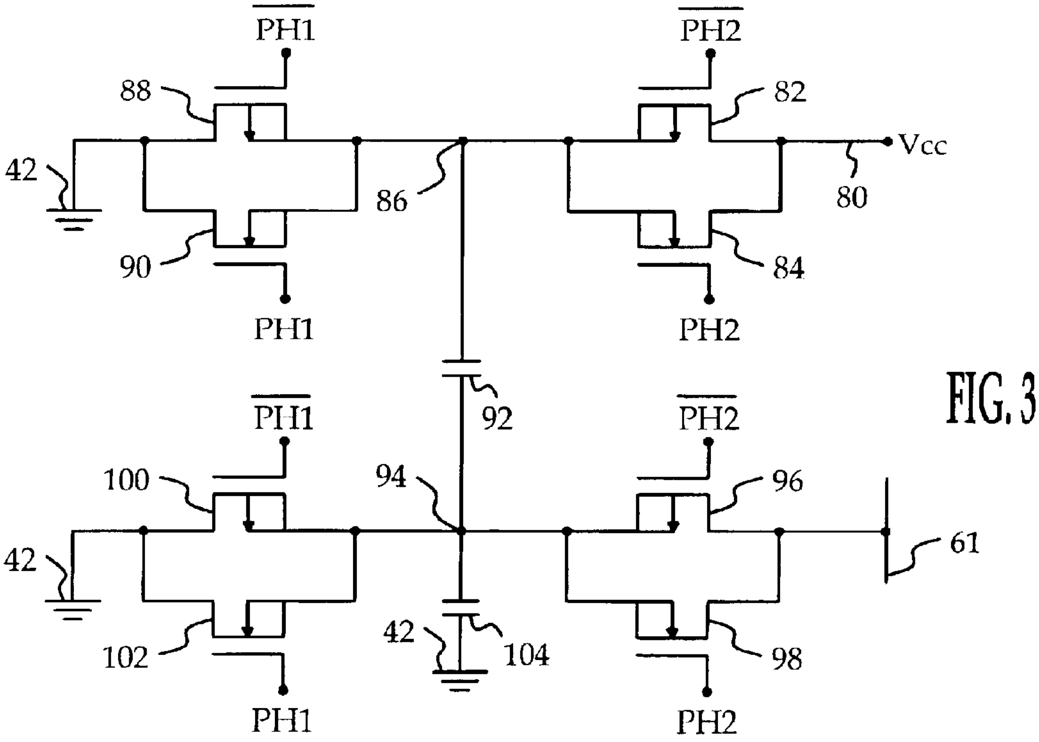
FIG. 3 is a diagram of a switched capacitor implementation of a configurable input impedance circuit for the oxygen sensor interface circuit of FIG. 2.

In the case of a narrow-band sensor, the switch 56 couples input line 61 of operational amplifier 48 to a bias voltage source 64 through a configurable resistance (CR) 62. The configurable resistance is remotely controlled by ECM 32 via line 58, and acts like either a 480 kohm resistor or a 1.2 megohm resistor, depending on the signal Rsel impressed on line 58 by ECM 32. At engine start-up when the sensor 24 is cold, its characteristic impedance is on the order of 5–10 megohms, and ECM 32 signals CR 62 to select the 1.2 megohm resistance to enable reliable cold sensor detection based on the output voltage Vout. Once the sensor 24 warms up and becomes operational, its characteristic impedance falls to a lower value (typically much less than 100 kohms), and ECM 32 signals CR 62 to select the 480 kohm resistance to enable reliable open-circuit detection accuracy, again based on the output voltage Vout. While the circuit may be implemented substantially as shown in FIG. 2, with switched discrete resistors in CR 62, the combination of switch 56, CR 62 and bias voltage source 64 is preferably implemented as a two-phase switched capacitor circuit coupled between a source voltage VCC and ground 42, with ECM 32 providing a two-phase clock signal PH1, PH2, as shown FIG. 3. Referring to FIG. 3, the capacitors 92 and 104 are joined at node 94 to form a capacitive divider, and the switch pairs 82/84, 88/90, 96/98, 100/102 are turned on and off by the clock signals PH1, PH2 as shown to alternately charge and discharge capacitors 92 and 104 at a switching frequency $f_s$ determined by ECM 32. The switched capacitor circuit generates an equivalent bias voltage $V_b$ according to:

$$V_b=VCC*[C_{92}/(C_{92}30\ C_{104})]$$

where $C_{92}$ and $C_{104}$ are the capacitances of capacitors 92 and 104; in the illustrated embodiment, $C_{92}$ and $C_{104}$ are selected so that Vb is 0.45V. The equivalent resistance $R_{eq}$ of the circuit varies with the switching frequency $f_s$, as follows:

$$R_{eq}=1/[(C_{92}+C_{104})*f_s]$$

Given the capacitance values for achieving the desired bias voltage, the switching frequencies for achieving the alternate resistance values of 480 kohlms and 1.2 megohms are easily determined. When the sensor 24 is a pumped-voltage or pumped-current sensor, phase PH2 can be maintained low to effectively duplicate the functionality of opening switch 56.

In the case of a pumped-voltage reference sensor, the switch 58 couples Vin_high to a configurable high impedance reference voltage via the resistor 70. The reference voltage is defined by an operational amplifier 66 configured as a voltage follower, the amplifier 66 receiving a reference voltage Vref from ECM 32 on line 68. Although the manufacturer specifies a resistor value of 56.2 kohms and a reference voltage of 1.8V for open-circuit sensor detection, the reference voltage Vref is configurable by ECM 32 according to this invention to enable identification of sensor harness leakage, as explained below. When Vref is the specified value of 1.8V, an open-circuit or cold sensor 24 results in an output voltage Vout equal to the product (1.8V*2.5), or 4.5V.

In the case of a pumped-current reference sensor, the switch 60 couples Vin_high to a current source 74 via the resistor 70. The current source 74 is powered by a 5V supply voltage as shown, and in the illustrated embodiment, sources a DC bias current of 8.5 uA. Should there be an open-circuit between input line 24*a* and sensor 24, the output voltage Vout on line 54 becomes equal to the maximum output voltage of operational amplifier 46 (i.e., the positive source voltage for the circuit 28), which indicates that the sensor 24 has either an open circuit or a short to battery.

Although the controlled switches 56–60 allow ECM 32 to configure the interface circuits 28, 30 for use with any of a number of types of oxygen sensors as explained above, such configurability alone does not address the diagnostic ambiguity due to sensor leakage. For example, moisture or contamination in or near the sensor harness or circuit board, or even manufacturing variability, can result in a parasitic leakage path between the sensor line 24*a* and either ground or battery voltage (14V in a typical implementation). The leakage can cause an output voltage Vout that is indiscernible from the voltage one would expect with an operational sensor under rich fueling conditions, or the voltage one would expect with an open-circuit failure. Thus, the possibility of sensor leakage paths rules out reliable sensor diagnostic testing with the traditional diagnostic procedures.

Figure 4:
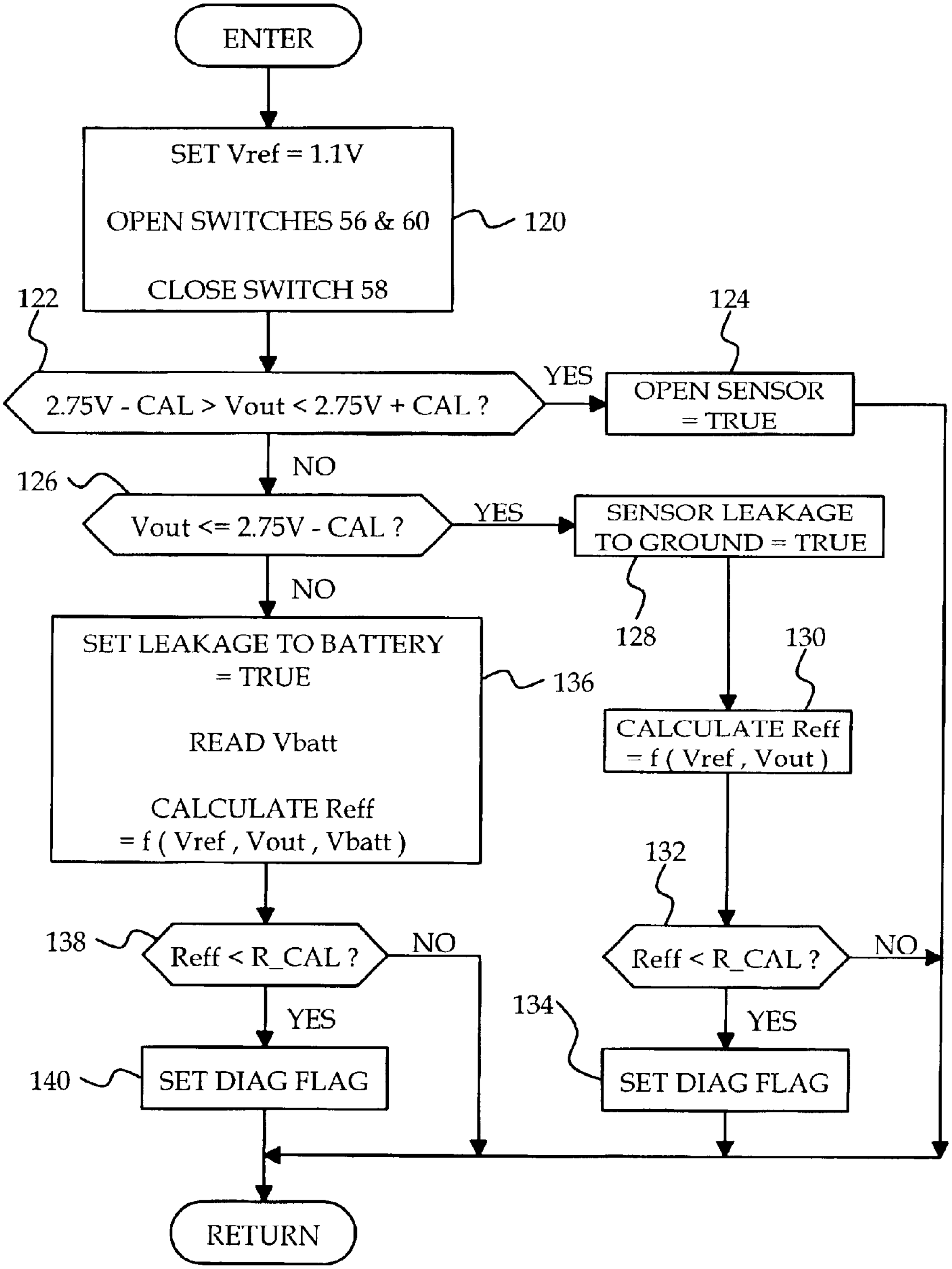
FIG. 4 is a flow diagram of a software routine executed by the engine control module for configuring the oxygen sensor interface circuit of FIG. 2 to diagnose sensor operation according to this invention.

The above-described problem of diagnostic ambiguity is addressed, according to this invention, by using the dynamic configurability of the interface circuits 28, 30 in order to specifically access the sensor leakage. In general, the reference voltage Vref is configured so that the output Vout has a value of approximately one-half the dynamic range of operational amplifier 48 when the sensor 24 has an open-circuit failure. For example, if ECM 32 sets Vref to 1.1V using a D/A output port, Vout will have a value of (1.1V*2.5), or 2.75V, when the sensor 24 is open-circuited. A sensor leakage path to battery will cause Vout to be higher than 2.75V, whereas a sensor leakage path to ground will cause Vout to be lower than 2.75V. In either case, ECM 32 can compute the effective resistance $R_{eff}$ of the leakage path based on Vref, Vout, and battery voltage Vbatt (which can be measured by ECM 32) in the case of a detected leakage path to battery. FIG. 4 depicts a simplified flow diagram for this procedure, wherein the block 120 initializes the lost by setting Vref to 1.1V, opening switches 56 and 60, and closing switch 58. Block 122 determines if Vout is within a calibrated value (CAL) of 2.75V. If so, the block 124 sets the OPEN SENSOR flag to TRUE, completing the routine. If not, there is significant sensor leakage, and block 126 determines whether the leakage path is to ground or battery. If the leakage path is to ground, block 126 will be answered in the affirmative; in this case, block 128 sets the LEAKAGE PATH TO GROUND flag to TRUE, and block 130 computes the effective leakage resistance Reff as a function of Vref and Vout. If $R_{eff}$ is low enough to prevent reliable sensor diagnostic detection, the block 132 will be answered in the affirmative, and block 134 sets a suitable diagnostic flag. If the leakage path is to battery, block 126 will be answered in the negative; in this case, block 136 sets the LEAKAGE PATH TO BATTERY flag to TRUE, reads the battery voltage Vbatt, and computes the $R_{eff}$ as a function of Vref, Vout and Vbatt. If Reff is low enough to prevent reliable sensor diagnostic detection, the block 138 will be answered in the affirmative, and block 140 sets a suitable diagnostic flag. The calibration value CAL takes into account variation in the reference voltage Vref, as it will typically be subject to a tolerance of ±5%; however, an additional configurable switch 150 as shown in phantom in FIG. 2 may be added to enable ECM 32 to measure Rref via operational amplifier 48 and eliminate error due to tolerance variation, if desired.

In summary, dynamically configuring an oxygen sensor interface circuit as described herein allows a single interface circuit to be used with different types of oxygen sensors, and significantly improves diagnostic reliability by selecting circuit components that are well suited to the diagnostic test and by ruling out false diagnostic indications due to sensor harness leakage. In a typical implementation, the ECM 32 will configure the interface circuit for the specified oxygen sensor 24, and conduct traditional cold-sensor diagnostic tests at engine turn-on to identify the moment at which the sensor warms up and becomes operational. When a presumed rich operational sensor is detected, the ECM 32 configures the interface circuit 38, 40 to measure the sensor harness leakage as described in reference to FIG. 4. If the leakage is too high to reliably diagnose proper sensor operation, a diagnostic flag is activated. If the leakage is insufficient to introduce diagnostic ambiguity, a warmed-up operational sensor is confirmed, and in the case of a narrow band sensor, CR 62 is configured to optimize open-circuit diagnostics. Since warmed-up sensor operation is detected quicker and more reliably, ECM 32 can begin closed-loop fuel control sooner than possible with conventional interface circuitry and diagnostic procedures.

While described in reference to the illustrated embodiment, it is expected that various modifications in addition to those mentioned above will occur to persons skilled in the art. For example, the invention is not limited to the illustrated types of oxygen sensors, the component and voltage values may differ in a given application, and soon. Accordingly, it Should be understood that interface circuits incorporating such modifications may fall within the scope of this invention, which is defined by the appended claims.

What is claimed is:

1. An interface circuit coupled to an electronic control unit and an exhaust gas oxygen sensor, comprising:

an amplifier having an input coupled to the oxygen sensor and an output coupled to the electronic control unit;

a plurality of different bias circuits for diagnosing the oxygen sensor, said bias circuits being designed in accordance with diagnostic requirements of different types of oxygen sensors; and dynamically configurable means controlled by the electronic control unit for connecting a selected one of said different bias circuits to the amplifier input so that the selected bias circuit is designed in accordance with diagnostic requirements of the oxygen sensor that is coupled to said interface circuit, wherein at least one of said bias circuits receives a reference voltage from said electronic control unit that is adjustable for diagnostic purposes when such bias circuit is selected by said dynamically configurable means, and said electronic control unit includes diagnostic means for setting said reference voltage to a diagnostic value that produces a known output of said amplifier when there is no electrical leakage path between said sensor and another electrical potential, and for diagnosing the existence of an electrical leakage path when the output of said amplifier is different than said known value.

2. The interface circuit of claim 1, wherein said electronic control unit is connected to a storage battery, and said diagnostic means diagnoses a leakage path between said sensor and said storage battery when the output of said amplifier is higher than said known value.

3. The interface circuit of claim 2, wherein said diagnostic means determines an effective resistance of the diagnosed leakage path as a function of said diagnostic value, a measured voltage of said storage battery, and the output of said amplifier.

4. The interface circuit of claim 1, wherein said electronic control unit is connected to a ground potential, and said diagnostic means diagnoses a leakage path between said sensor and said ground potential when the output of said amplifier is lower than said known value.

5. The interface circuit of claim 4, wherein said diagnostic means determines an effective resistance of the diagnosed leakage path as a function of said diagnostic value and the output of said amplifier.

* * * * *